(12) United States Patent
Lind

(10) Patent No.: US 6,883,733 B1
(45) Date of Patent: Apr. 26, 2005

(54) TAPERED POST, SHOWERHEAD DESIGN TO IMPROVE MIXING ON DUAL PLENUM SHOWERHEADS

(75) Inventor: Gary Lind, Atascadero, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/113,339

(22) Filed: Mar. 28, 2002

(51) Int. Cl.[7] ................................................. B05B 7/06
(52) U.S. Cl. ..................................... 239/424; 239/423
(58) Field of Search ............................. 239/418, 423, 239/424, 424.5

(56) References Cited

U.S. PATENT DOCUMENTS

| | | | | |
|---|---|---|---|---|
| 1,971,287 A | * | 8/1934 | Walker | ........................ 239/419 |
| 6,050,085 A | * | 4/2000 | Mayer | ......................... 60/211 |
| 6,080,446 A | * | 6/2000 | Tobe et al. | ........... 427/255.394 |

* cited by examiner

*Primary Examiner*—Christopher Kim
(74) *Attorney, Agent, or Firm*—DeLio & Peterson, LLC

(57) ABSTRACT

This invention provides a showerhead and method for allowing reaction gases to immediately mix upon release from gas outlets and minimize deposits of unwanted contaminants on the tip of a gas outlet and faceplate of the showerhead. A post having a central opening extends into the faceplate for emitting a first gas and is directly and circumferentially surrounded by an annular opening for emitting a second gas. The post may be recessed from, flush with or extend a distance past a frontal surface of the faceplate. A plurality of apertures, for emitting the second gas, may circumferentially surround the annular opening. The annular opening releases the second gas at a pressure and velocity sufficient to intermix with first gas released from the post while simultaneously forcing any unreacted gas and gaseous mixtures away from the tip of the post and frontal surface of the faceplate, thereby avoiding depositing contaminants thereon.

20 Claims, 7 Drawing Sheets

TAPERED POST, SHOWERHEAD DESIGN TO IMPROVE MIXING ON DUAL PLENUM SHOWERHEADS

BACKGROUND OF THE INVENTION

1. Field of the Invention

The invention relates to an apparatus and method used in chemical vapor deposition (CVD) of films using a gas or plasma, and more particularly, to a dual plenum "showerhead" apparatus and method of depositing a gas mixture using chemical vapor deposition.

2. Description of Related Art

Typically, the chemical vapor deposition (CVD) occurs in a reaction process chamber or reactor chamber that provides a low-conductance, contaminant-free environment for flowing gases or plasma over the substrate in a uniform manner. Alternatively, CVD may be performed in a high-conductance reaction process chamber that provides a relatively large flow of process gas to achieve a uniform film deposition.

Generally, in CVD processes, gaseous reactants are introduced into the reaction process chamber whereby they decompose and react at a heated surface of a substrate to form a desired film thereon. The CVD films are deposited on wafers in a controlled environment in the reaction chamber to provide controlled thin-film depositions, as well as thin film etching and surface treatments, such as, cleaning. In so doing both the CVD plasma deposition and plasma etch processes occur within the reaction chamber to either deposit a film onto surfaces of a wafer or remove a film on a wafer contacting the plasma by etching. In the fabrication of microelectronic devices, CVD is often the preferred process for depositing thin films on substrates due to its ability to provide highly conformal layers even in deep contacts and other openings. For example, CVD processes are used for depositing materials on substrates to fabricate semiconductor IC chips.

Known processes of plasma CVD and plasma etch occurring within a reactor chamber may include a pair of electrodes and a radiofrequency source which, in combination, generates a discharge between the electrodes to ionize reactive gases therein. These ionized gases form a plasma which deposits the non-volatile solid film onto the substrate by the reaction of vapor phase reactants, or etches the film off of, surfaces in contact with the plasma. For example, in plasma CVD, a semiconductor wafer is clamped to one of the electrodes so that selected films can be deposited onto a workpiece surface exposed to the plasma between the electrodes. Successive exposures to differing plasmas can create desirable semiconductor films on the surface. Similarly, in plasma etch, coatings or films can be removed selectively when exposed to plasmas formed by appropriate etch gases, e.g., carbon tetrafluoride.

Additionally, high voltage electrodes, arranged with a plurality of gas outlets, may extend there-through the reaction chamber so that reactive gases may be injected through the outlets and between the electrodes to uniformly distribute gases over the surface of a workpiece. The outlets are generally a series of holes extending through the electrode and connected to the appropriate gas source. Typically, high voltage electrodes in this type of configuration are referred to as a "showerhead" electrode because of its appearance and similarity to a common bathroom showerhead.

Conventional CVD systems use a showerhead arrangement to alleviate the deposition of a bell-shaped film thickness. Typically, such bell-shaped film thickness is formed as a result of single wafer CVD systems feeding gases above and perpendicular to a substrate wafer whereby the center of the substrate tends to receive a higher concentration of process chemicals, resulting in faster thin-film material growth at the center of the substrate than at the edges. The showerhead arrangements alleviate this difficulty by flowing the precursor gas from above the showerhead into a centrally-located inlet of the showerhead housing. In so doing the showerhead typically has a showerhead gas dispersion plate including several hundred small openings to allow a low-conductance flow of the gases to the CVD reaction chamber for more uniform distribution across the substrate.

However, such conventional showerhead arrangements disadvantageously emit high concentrations of one gas from a nozzle or post of the CVD system within specific areas in the reaction chamber. Such high concentrations of one gas is undesirable within the reactor since thorough mixing of multiple gases in the CVD reactor facilitates and improves the deposition of the gases or plasma to form a film on the wafer surface. Another disadvantage may occur when there is insufficient gas mixing in front of the orifices emitting the gases into the reactor. In such situations, a build-up of unwanted deposits may occur on the showerhead including, for example, a high carbon film. Such unwanted deposits on the showerhead are undesirable as they are difficult to remove and they etch very slowly. Furthermore, these unwanted deposits may interfere with the desirable intermixing of the desired emitted gases such as, for example, the intermixing of $NH_3$ and TDEAT, to lessen the deposition rate of such mixed gases on the wafer, thereby negatively affecting the efficiency and reliability of the CVD film process.

Accordingly, a need continues to exist in the art for improved CVD systems and processes which decrease the build-up of unwanted deposits on a showerhead and which effectively and efficiently mix desired gases in front of the orifices emitting such gases into the reaction chamber to improve the deposition thereof and thereby form conformal films on a wafer surface.

Bearing in mind the problems and deficiencies of the prior art, it is therefore an object of the present invention to provide an improved showerhead apparatus and method which more effectively and efficiently mix gases in a CVD reactor chamber.

It is another object of the present invention to provide a showerhead apparatus and method which encourage mixing of desired gases in front of the orifices emitting such gases into the CVD reactor chamber.

Another object of the present invention is to provide a showerhead apparatus and method which minimize unwanted particle levels on a face area of the showerhead and on the tip of a gas outlet.

It is a further object of the present invention to provide a showerhead apparatus and method which form a conformal film on a wafer surface in a CVD process.

Still another object of the present invention is to provide a showerhead apparatus and method which improve the efficiency and reliability of a CVD film process.

Yet another object of the present invention is to provide a showerhead apparatus and method which improves the utilization of the deposition materials.

Another object of the present invention is to provide a showerhead apparatus and method which allow for easier and faster cleaning of the showerhead faceplate and the tip of the gas outlet after the deposition process.

Still other objects and advantages of the invention will in part be obvious and will in part be apparent from the specification.

SUMMARY OF THE INVENTION

The above and other objects, which will be apparent to those skilled in art, are achieved in the present invention which is directed to, in a first aspect, a showerhead apparatus for mixing a plurality of gases. The showerhead apparatus includes a faceplate, a post having a central opening, and an annular opening. The post extends into the faceplate and is adapted to emit a first gas. The annular opening traverses through the faceplate to directly and entirely surrounding the post extending into the faceplate whereby the annular opening and is adapted to emit a second gas. The first and second gases are emitted coaxially to each other so that the first and second gases immediately intermix upon release from the post and the annular opening, and simultaneously force away any unreacted first gas and gaseous mixtures from a tip of the post and a surface of the faceplate. The first gas may be TDEAT or TDMAT, while the second gas may be $NH_3$.

Optionally, the showerhead apparatus for mixing a plurality of gases may further include a plurality of apertures traversing through the faceplate. These plurality of apertures are located circumferentially about the annular opening, and are adapted to emit the second gas. The plurality of apertures may still further include at least one of the plurality of apertures having an enlarged portion contiguous with a smaller frontal opening thereof such at least one of the plurality of apertures.

In one embodiment of the invention, the post may extend into the faceplate and be flush with the surface of the faceplate. In such an embodiment, the first and second gases immediately mix at a location in direct contact with the surface of the faceplate.

In another embodiment, the post may extend into the faceplate and be recessed from the surface of the faceplate. The post may be recessed from a surface of the faceplate to a distance of about 0.12 inches. In this embodiment, the first and second gases immediately mix at a location between the tip of the post and the surface of the faceplate.

In still another embodiment of the invention, the post may extend into the faceplate and extend past the surface of the faceplate. The post may extend past the surface of the faceplate to a distance of about 0.25 inches. In such embodiment, the first and second gases immediately mix at a location past a location of the surface of the faceplate.

In accordance with the first aspect of the invention, the post may have a diameter ranging from about 0.06 inches to about 0.05 inches. The post may further include an inward tapered frontal portion at an end thereof. This inward tapered frontal portion of the post may have a diameter at a top portion of the tapered portion of about 0.06 inches to about 0.05 inches, and the diameter may taper, i.e., a tapered diameter, as the tapered frontal portion of the post approaches the tip of the post. The tapered diameter at the tip of the post, or the bottom portion of the inward tapered frontal portion, may range from about 0.02 inches to about 0.25 inches.

Likewise, the annular opening of the invention may have a width ranging from about 0.21 inches to about 0.005 inches. The annular opening may also taper inward toward the post. In such an embodiment, the tapering of the annular opening may be either uniform or non-uniform as the annular opening traverses through the faceplate.

In a second aspect, the invention is directed to a showerhead apparatus for mixing a plurality of gases. The showerhead apparatus includes a faceplate, a post having a central opening, and an annular opening. The post extends into the faceplate and is adapted to emit a TDEAT gas. The annular opening traverses through the faceplate to directly and entirely surrounding the post extending into the faceplate whereby the annular opening is adapted to emit an $NH_3$ gas. The TDEAT and $NH_3$ gases are emitted coaxially to each other so that the TDEAT and $NH_3$ gases immediately intermix upon release from the post and the annular opening. Simultaneously, the $NH_3$ gas forces any high TDEAT concentrations and TDEAT/$NH_3$ gaseous mixtures away from a tip of the post and a surface of the faceplate.

In the second aspect, the post and the annular opening may both taper inward toward the central opening in the post. The annular opening may taper uniformly or non-uniformly as the annular opening traverses through the faceplate.

In a third aspect, the invention is directed to a method for mixing a plurality of gases in a showerhead. The method includes providing a faceplate, emitting a first gas through a central opening in a post extending into the faceplate and emitting a second gas coaxially to the first gas through an annular opening traversing through the faceplate. The annular opening is directly and entirely surrounding the post. The first and second gases are intermixed upon release from the post and the annular opening to form a gaseous mixture. In such method, the second gas simultaneously forces away any unreacted first gas and gaseous mixture from a tip of the post and a surface of the faceplate to minimize forming contaminating deposits thereon.

In accordance with such method, the second gas forces away any unreacted first gas and gaseous mixture from the tip of the post and faceplate by emitting the second gas from the annular opening at a velocity that is greater than a velocity of any back diffusion of the first gas. The showerhead may be provided within a chemical vapor deposition reaction chamber for forming a film on a wafer surface using the gaseous mixture.

BRIEF DESCRIPTION OF THE DRAWINGS

The features of the invention believed to be novel and the elements characteristic of the invention are set forth with particularity in the appended claims. The figures are for illustration purposes only and are not drawn to scale. the invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–9 of the drawings in which like numerals refer to like features of the invention.

In the manufacture of semiconductor devices, often barrier layers are used to prevent mutual diffusion or chemical reactions between different materials, and as such, are indispensable to stabilize the contact interfaces of such semiconductor devices. Typically, barrier layers, such as a TiN, TaN or WN barrier layers, are formed by chemical vapor deposition (CVD) processes. For example, a TiN barrier layer may be formed by CVD using a showerhead whereby $NH_3$ and TDEAT (Tetrakis Diethylamido Titanium) are emitted as a source at a temperature of about 200° C. to 700° C.

Figure 8A:
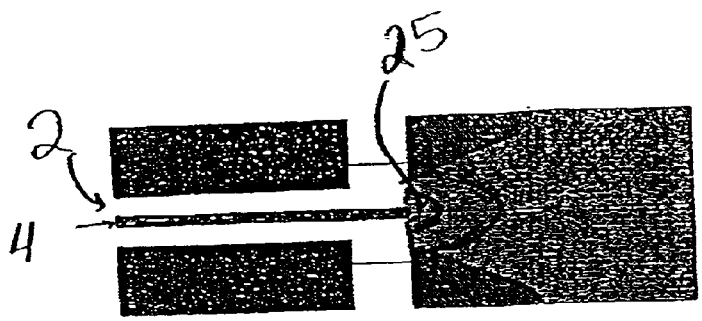
FIGS. 8A–8D show the results of a comparative study performed in accordance with the present invention in comparison to a conventional showerhead apparatus emitting only TDEAT.

In such conventional apparatus and techniques, the dual plenum showerheads typically include a TDEAT plenum and a $NH_3$ plenum. The TDEAT plenum area feeds a field of orifices drilled through a field of posts which are coaxial with the orifices. These posts protrude through the $NH_3$ plenum area and into a faceplate of the showerhead, which is effectively sealed around the posts with a tight mechanical fit. The $NH_3$ plenum is thus able to flow into the chamber through the field of orifices in the faceplate. In so doing, the field of TDEAT orifices that release TDEAT into the chamber mixes with the $NH_3$ being released through the faceplate whereby the mixing occurs directly in front of the showerhead faceplate. The resultant mixture of TDEAT/$NH_3$ in front of and radially surrounding the TDEAT gas outlet (as shown in FIG. 8A) is very high in TDEAT, i.e., the concentration of TDEAT is greater than the concentration of $NH_3$. It has been found that these areas of high TDEAT to $NH_3$ gaseous mixtures deposit a film of high carbon concentration as impurities or unwanted deposits onto the tip of the TDEAT gas outlet as well as onto the faceplate of the showerhead. These high carbon concentration impurities, or unwanted deposits, are undesirable as they are difficult to remove, etch very slowly, interfere with the desirable intermixing of the desired emitted gases such as, for example, the intermixing of $NH_3$ and TDEAT for forming a TiN barrier layer on a wafer surface, and they consume the deposition materials by depositing the same onto the showerhead rather than the wafer surface.

Advantageously, the present invention overcomes the above problems of conventional dual plenum showerheads and processes by minimizing the amount of deposits of unwanted high carbon concentration impurities on the tip of the TDEAT gas outlet, as well as perhaps on the faceplate, by allowing only a small area of high TDEAT concentration in the TDEAT/$NH_3$ mixture to be in direct contact with the tip of the TDEAT post. That is, the invention provides for only trace amounts of high TDEAT concentrations to be directly in front of the tip of the TDEAT post, thereby minimizing the amount of unwanted carbon impurities to be deposited onto the tip of the TDEAT gas post. Unexpectedly, the instant invention reduces any areas of high TDEAT concentrations in the TDEAT/$NH_3$ mixture up to 50% or more of typical concentrations, preferably by about 90% to about 92%, while simultaneously directing such TDEAT concentrations to be only directly in front of the tip of the TDEAT post. In so doing, the invention provides a $NH_3$ plenum flow coaxial to a TDEAT flow from a TDEAT post, or nozzle, and preferably shapes the TDEAT gas outlet or post so that the $NH_3$ flow remains in immediate direct contact with the released TDEAT gas so as to create the small area of high TDEAT/$NH_3$ concentration in contact with the tip of the TDEAT post and/or the faceplate. The invention also eliminates the deposition rate trend, i.e., the trend of starting with an initial low deposition rate which returns to a conventional deposition rate after a plurality of deposition cycles. The invention also allows for easier and efficient cleaning of the TDEAT gas outlet and showerhead due to the decreased levels of contaminants thereon.

The present invention will be better understood in view of the description below in reference to FIGS. 1A–9.

Figure 1A:
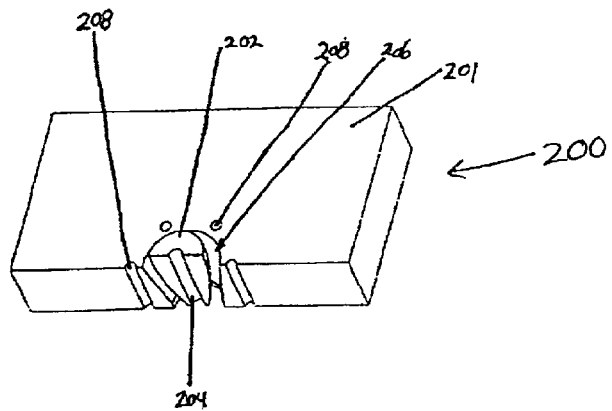
FIG. 1A is a top perspective half-sectional view of a preferred showerhead apparatus of the present invention.
Figure 1B:
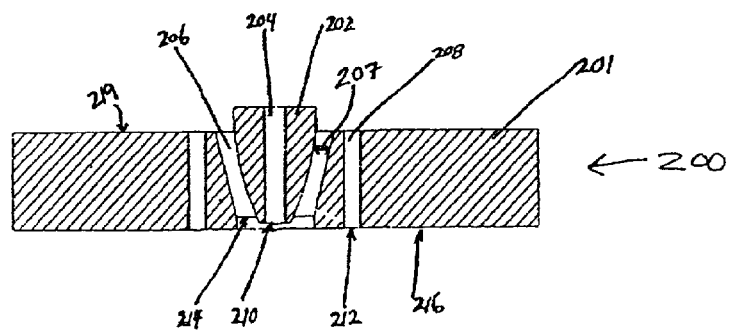
FIG. 1B is a cross sectional elevational view of the showerhead of FIG. 1A.

Referring to FIGS. 1A and 1B, the present invention provides an improved multi-port showerhead which allows the reaction gases to immediately mix upon release from their correlating gas outlets. Preferably, the instant showerhead apparatus is for intermixing two gases, more preferably for intermixing TDEAT or TDMAT (Tetrakis Dimethlyamido Titanium) and ammonia ($NH_3$), preferably TDEAT and $NH_3$, in a showerhead arrangement. The TDEAT and $NH_3$ gases are released from their correlating gas outlets whereby the $NH_3$ immediately mixes with the TDEAT to provide a TDEAT/$NH_3$ gaseous mixture. Theoretical reaction ratios of the TDEAT/$NH_3$ gaseous mixture is 1:4, however, due to the incomplete reaction, a high degree of unreacted TDEAT remains which contaminates the gas outlet and/or faceplate. Accordingly, the present invention provides a 1:500 reaction ratio of the TDEAT/$NH_3$ gaseous mixture.

In accordance with the invention, the $NH_3$ gas is forced in front of the TDEAT gas outlet, or post, to both shield the tip of the TDEAT gas outlet with the $NH_3$ gas while at the same time immediately mixing therewith the TDEAT gas to provide the TDEAT/$NH_3$ mixture. The released $NH_3$ gas forces the TDEAT/$NH_3$ mixture away from the a frontal tip of the TDEAT gas outlet, as well as a frontal surface of the faceplate of the showerhead, thereby avoiding contaminating deposits thereon. The $NH_3$ gas is forced out of its respective outlet at a high velocity as well as being forced out coaxially to the release of the TDEAT gas from its respective gas outlet to force the TDEAT away from the tip of the TDEAT gas outlet, and the faceplate, and avoiding unwanted particles from depositing thereon. In so doing, the $NH_3$ gas is forced out of its respective outlet at a sufficiently high pressure and velocity whereby the velocity is greater than the velocity of the back diffusion of the TDEAT gas. That is, the release of the NH₃ gas is at a pressure and velocity sufficient to push the TDEAT away from the tip of the TDEAT gas outlet thereby minimizing the back diffusion of TDEAT. The pressure and velocity of the release of the NH₃ gas may vary widely in accordance with the particular design and conditions of the post and annular opening in accordance with the present invention.

Figure 1C:
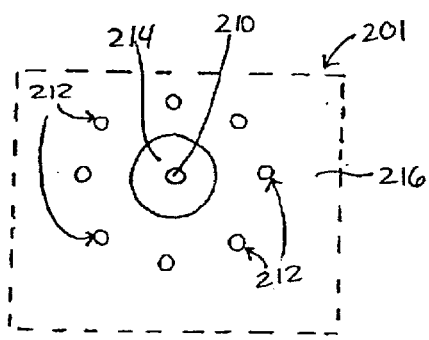
FIG. 1C is a portion of a cross sectional frontal planar view of a faceplate of the showerhead apparatus of FIG. 1A showing a cross sectional frontal planar view of the arrangement of the post, annular opening and plurality of apertures of FIG. 1A.

As shown in a first embodiment of the invention in FIGS. 1A and 1B, a showerhead arrangement 200 includes a faceplate 201 having a centrally located post 202, or nozzle, for emitting a gas, an annular opening 206 and a plurality of apertures 208 all traversing there-through the faceplate 201. The post 202 includes a substantially central opening 204 extending there-through whereby the opening 204 is designed and adapted to preferably emit TDEAT or TDMAT. The annular opening 206 is in direct contact with adjacent post 202 and is positioned entirely circumferentially about the post 202, while the plurality of apertures 208 are positioned adjacent to, at a distance away from and circumferentially about the annular opening 206. Both the annular opening 206 and the apertures 208 are designed and adapted to preferably emit NH₃. In a preferred embodiment, the plurality of apertures 208 may be located at a distance of about 0.03 inches to about 0.15 inches from an outer perimeter of the annular opening 206. Preferably, the complete gas outlet features of the invention, as shown in FIGS. 1A–1C, repeat in an array across the faceplate whereby such gas outlet features are replicated and share the plurality of apertures 208 with an adjacent gas outlet feature.

The TDEAT or TDMAT gas is emitted from a supply source (not shown) through the opening 204 in post 202 and is released at a front surface 216 of faceplate 201 via frontal opening area 210. Likewise, the NH₃ gas is emitted from a supply source (also not shown) through the annular opening 206 and plurality of apertures 208 and released at front surface 216 via frontal opening areas 214 and 212, respectively. The frontal area 210 of the substantially central opening 204 in the post 202 and the annular frontal area 214 are directly adjacent one another to provide maximum intermixing of NH₃ through annular opening 206, in combination of NH₃ through apertures 208, with TDEAT through the central opening 204. As shown in the dotted line configuration of FIG. 1C, a partial view of faceplate 201 shows at the frontal surface 216 of the faceplate that the frontal opening area 210 is directly adjacent the frontal opening 214 while the frontal opening areas 212 of the plurality of apertures 208 are located at a distance away from frontal opening 214. The frontal opening 214 entirely surrounds the opening area 210 while the frontal opening areas 212 entirely surround the frontal opening 214 at discrete distances and locations.

In the instant invention, the annular opening 206 completely surrounds the post 202 and is in direct contact with the post 202. In so doing, the NH₃ gas is emitted through annular opening 206 at a pressure and velocity sufficient to intermix with the TDEAT and force any high TDEAT concentrations away from the tip of the post. Thus, the annular opening 206 releases the ammonia at a high pressure and velocity when exiting the annular opening frontal portion 214 thereby immediately mixing with the TDEAT upon release from the post opening 204 to form the TDEAT/NH₃ mixture in combination with simultaneously forcing both any remaining unreacted TDEAT and the TDEAT/NH₃ mixture away from both the tip of the post 202 at opening 210 as well as away from the frontal surface 216 of the faceplate 201.

Figure 5:
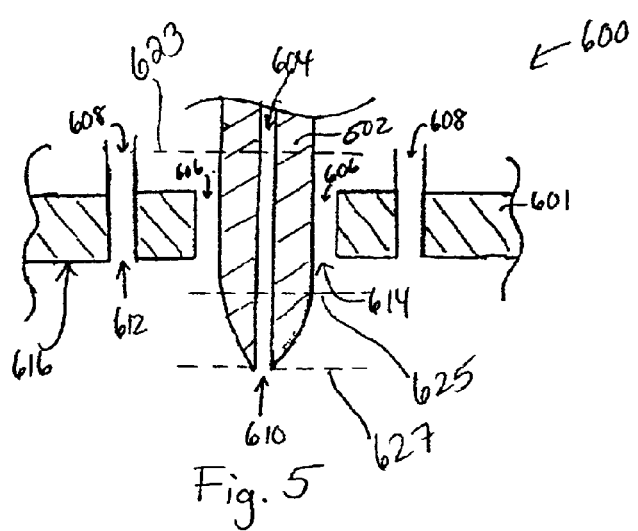
FIG. 5 is a cross-sectional view of a showerhead apparatus of the present invention showing a post and annular opening arrangement whereby the post extends past a frontal surface of a faceplate of the present showerhead.

The post may have a diameter ranging from about 0.06 inches to about 0.05 inches at a top portion of the post, as shown by dotted line 623 in FIG. 5. Referring to FIG. 5, the post may further include an inward tapered frontal portion at an end thereof whereby the inward tapered portion may have a conical, rounded or spherical shape. At the top of the tapered portion, as shown by dotted line 625, the inward tapered frontal portion of the post may have a diameter ranging from about 0.06 inches to about 0.05 inches. As the tapered portion extends toward the faceplate and approaches the tip of the post, the diameter may taper, i.e., have a tapered diameter. At the bottom of the tapered portion, as shown by dotted line 627, the inward tapered portion may have a diameter ranging from about 0.02 inches to about 0.25 inches, whereby the diameter between the top 625 and bottom 627 of the tapered portion decreases as the bottom of the tapered portion is approached corresponding to the selected shape of the tapered portion.

Figure 2A:
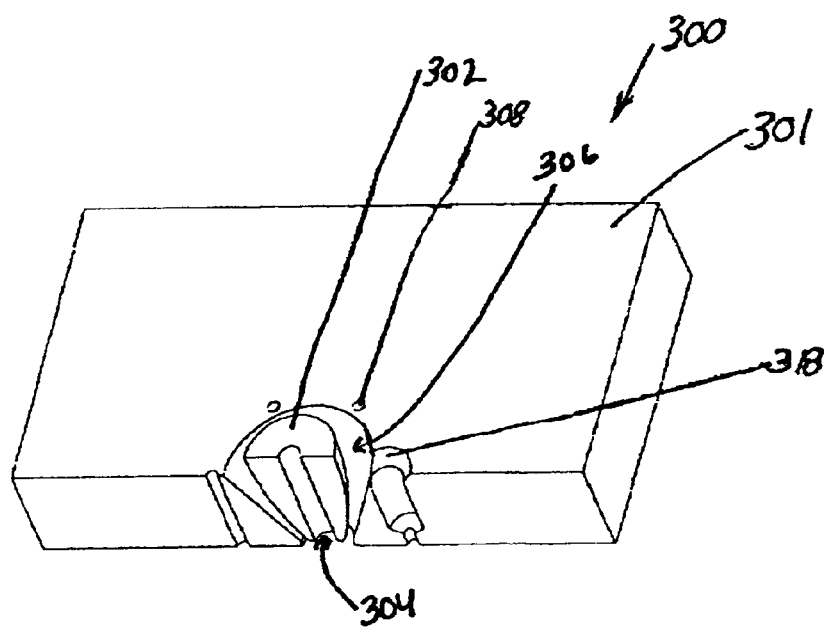
FIG. 2A is a top perspective half-sectional view of another embodiment of a showerhead apparatus of the present invention.

Annular opening 206 may have a width 207, 307 around post 202 ranging from about 0.21 inches to about 0.005 inches. The width 207, 307 of annular opening frontal portion 214 of annular opening 206 preferably ranges from about 0.10 inches to about 0.005 inches, more preferably from about 0.030 inches to about 0.010 inches. The annular opening 206 may be uniform in width as it traverses through the faceplate 201 directly along side of post 202 (as shown in FIGS. 1A, 1B, 4C, 5 and 6), the annular opening 206 may taper as it traverses through the faceplate 201 (as shown in FIGS. 1A through 3B), or alternatively, it may taper at a non-uniform width as it traverses through the faceplate 201 (as shown in FIGS. 2A through 3B). Wherein the annular opening 206 tapers as it traverses through the faceplate 201, the post 202 may also taper to an extent equal to the tapering of the tapered annular opening 206. Alternatively, as shown in FIGS. 2A and 2B, the annular opening 306 may be tapered to a greater extent than the post 302 whereby the annular opening is tapered such that the beginning width of the opening contacting rear portion 319 of the faceplate 301 has a greater width than the annular opening 314 which communicates with the frontal surface 316 of the faceplate 301.

It will be understood that the advantages of the embodiment of the invention as shown and described above in relation to FIGS. 1A–1B also apply to the embodiments as described further below.

Figure 2B:
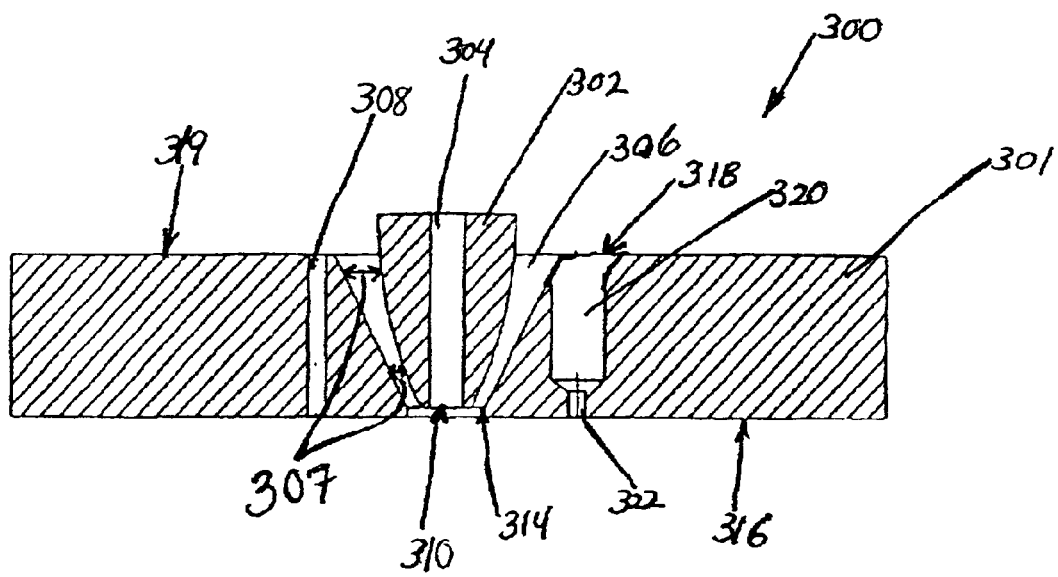
FIG. 2B is a cross sectional elevational view of the showerhead of FIG. 2A.

In another embodiment of the invention, as shown in FIGS. 2A and 2B, a showerhead arrangement 300 includes a faceplate 301 having a centrally located post 302 having a central opening 304 terminating in a frontal area 310 for emitting TDEAT or TDMAT, an annular opening 306 terminating in a frontal area 314 for emitting NH₃ and a plurality of apertures 308 for emitting NH₃. Annular opening 306 is directly adjacent post 302 and is positioned circumferentially about the post 302. In such an embodiment, the showerhead 300 further includes an opening 318 having a contiguous enlarged area 320 in direct contact with a substantially smaller opening frontal portion 322 in direct contact with frontal portion 316 of the opening 318 and a rear surface 314 of the faceplate 301. An advantage of this design, is in its reduced manufacturing costs and the ease of manufacturing when providing a larger opening, i.e., enlarged area 320, there-through faceplate 301.

Figure 3A:
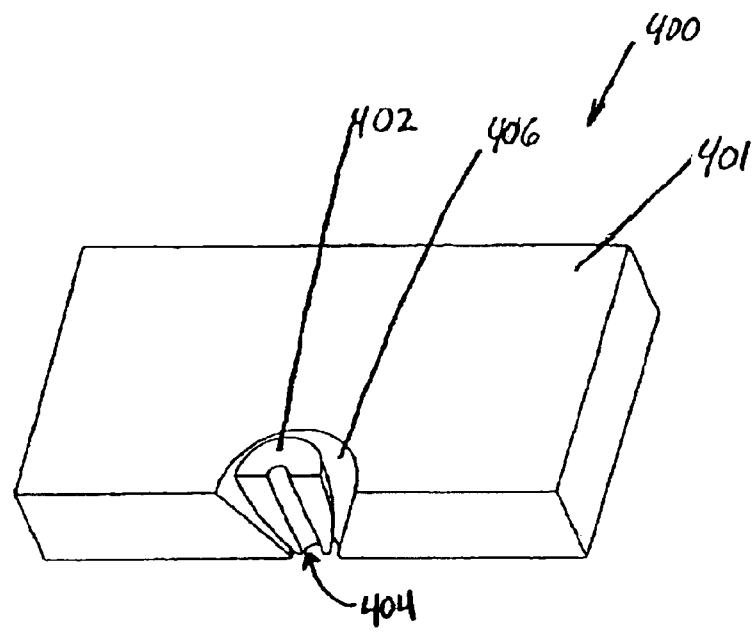
FIG. 3A is a top perspective half-sectional view of yet another embodiment of the showerhead apparatus of the present invention.
Figure 3B:
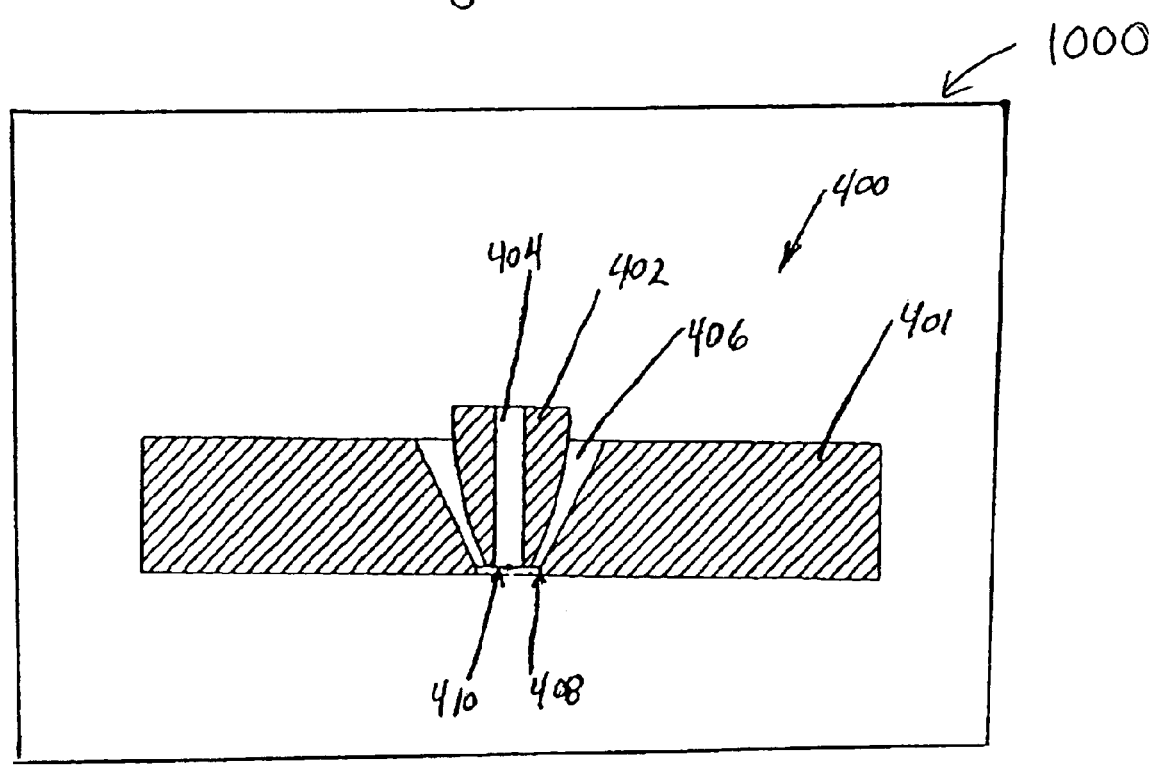
FIG. 3B is a cross sectional elevational view of the showerhead of FIG. 3A.

In the preferred embodiment, as shown in FIGS. 3A and 3B, a showerhead apparatus 400 may only include a substantially centrally located post 402, having a substantially central opening 404, and an annular opening 406 positioned directly and circumferentially about the post 402, all traversing through a faceplate 401 of the showerhead 400. In such an embodiment, the TDEAT or TDMAT gas is emitted from a supply source (not shown) through the opening 404 and is released via a frontal opening area 410, while the NH$_3$ gas is emitted from a supply source (also not shown) through the annular opening 406 and released via a frontal opening areas 408. As discussed in detail above, the frontal area 410 of the substantially central opening 404 and the annular frontal area 408 are directly adjacent one another to provide maximum intermixing of NH$_3$ through annular opening 406 with TDEAT through the central opening 404 to form the TDEAT/NH$_3$ mixture and simultaneously carry away any unreacted TDEAT and TDEAT/NH$_3$ mixture from the frontal tip of post 401 and the frontal surface of faceplate 401 thereby minimizing unwanted carbon deposits thereon. The showerhead may be provided within a chemical vapor deposition chamber 1000 for forming a film on a wafer surface using such gaseous mixture, as discussed below with respect to FIG. 7.

Figure 4:
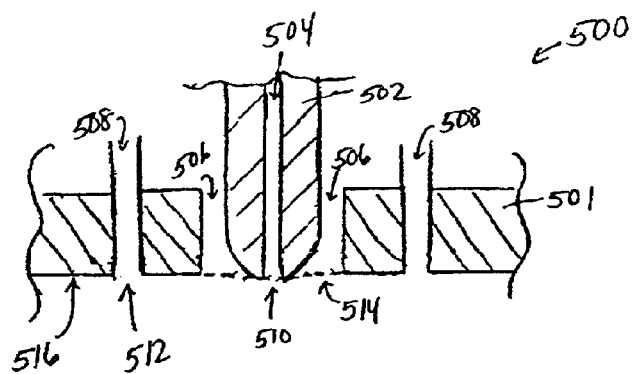
FIG. 4 is a cross-sectional view of a showerhead apparatus of the present invention showing a post and annular opening arrangement whereby the post is flush with a frontal surface of a faceplate of the present showerhead.
Figure 6:
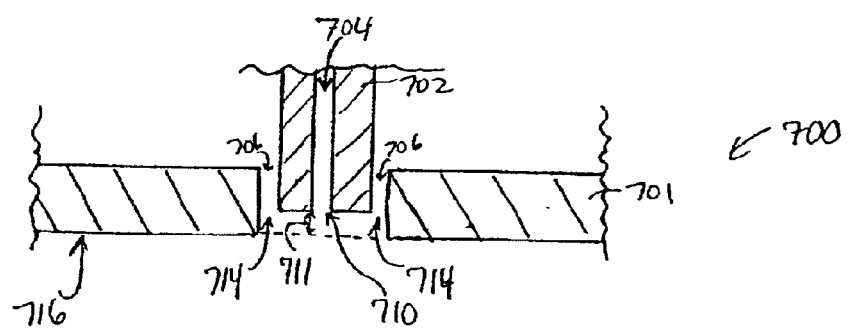
FIG. 6 is a cross-sectional view of a showerhead apparatus of the present invention showing a post and annular opening arrangement whereby the post is recessed from a frontal surface of a faceplate of the present showerhead.

Further embodiments of the present invention are shown in FIGS. 4–6. whereby it is shown that in accordance with the invention, the centrally located posts may be recessed from a frontal surface of the faceplate (as shown in FIGS. 1A through 3B and 6), it may be flush with a frontal surface of the faceplate (as shown by the dotted line in FIG. 4), or it may extend past a frontal surface of the faceplate (as shown in FIG. 5).

Referring to FIGS. 4–6, showerhead arrangements 500, 600, 700 include faceplates 501, 601, 701 having centrally located elongated posts 502, 602, 702 each having substantially central openings 504, 604, 704 extending therethrough the faceplates whereby the openings 504, 604, 704 are designed and adapted to preferably emit TDEAT or TDMAT. The showerhead arrangements also include annular openings 506, 606, 706 traversing through the faceplate whereby the annular openings, and optionally as shown in FIGS. 4 and 5, a plurality of apertures 508 and 608. The annular openings and the plurality of apertures are designed and adapted to preferably emit NH$_3$. As discussed in detail above, the annular openings are in direct contact with the adjacent posts and are positioned entirely circumferentially about the posts. TDEAT or TDMAT gas is emitted from a supply source (not shown) through the central openings 504, 604, 704 and is released at a front surface 516, 616, 716 of the faceplates via frontal opening areas 510, 610, 710. The NH$_3$ gas is emitted from a supply source (also not shown) through annular openings 506, 606, 706 and the plurality of apertures 508, 608 and released at the front surface via frontal opening areas 514, 614, 714 and 512, 612, 712, respectively.

As shown in FIG. 4, the elongated centrally located post 502, preferably having a tapered tip or a generally cone-shaped tip, may be flush with the frontal surface 516 of the faceplate 301, as shown by the dotted line of FIG. 4. In the present invention, wherein the centrally located post is flush with the frontal surface of the faceplate, the NH$_3$ gas immediately mixes with the TDEAT to form the TDEAT/NH$_3$ mixture directly at the location of the faceplate and forces unreacted TDEAT and the mixture away from both the tip of the post 202 and the frontal surface of the faceplate. In accordance with such embodiment, the tapered tip of the post is preferred as it further enhances the intermixing of the TDEAT and NH$_3$ gases directly in front of the tapered tip to further reduce the amount of contaminates deposited onto the tip.

Referring to FIG. 5, the elongated centrally located post 602 having the tapered tip may extend past the frontal surface 616 of the faceplate 601. The post may extend past a frontal surface of the faceplate to a distance of about 0.25 inches, preferably 0.03 inches. Wherein the post extends to a predetermined or desired distance past a frontal surface of the faceplate, the NH$_3$ gas immediately mixes with the TDEAT to form the TDEAT/NH$_3$ mixture beyond the faceplate and forces unreacted TDEAT and the mixture away from the tip of the post.

Further, the centrally located posts of the invention may be recessed from a frontal surface of the faceplates (as shown in FIGS. 1A through 3B and 6). The post may be recessed from the frontal surface of the faceplate to a distance of about 0.12 inches, preferably 0.03 inches. Referring to FIG. 6, wherein the centrally located post 702 is recessed from a frontal surface 716 of the faceplate 701, the NH$_3$ gas upon release from the annular opening 706 immediately mixes with the TDEAT upon release from the post opening 704 to form the TDEAT/NH$_3$ mixture directly between the tip of the post 702 at opening 710 and the frontal surface 716 of the faceplate 701, i.e., area 711 as shown in FIG. 6. The NH$_3$ gas forms the TDEAT/ NH$_3$ mixture while simultaneously forcing both any remaining unreacted TDEAT and the TDEAT/ NH$_3$ mixture away from both the tip of the post 702 at opening 710, as well as away from the frontal surface of the faceplate, and through the faceplate for deposition onto a wafer surface. Still further as shown in FIG. 6, the post 702 may be formed as a cylinder, i.e., not having a tapered tip, whereby the annular opening 706 is also formed in a cylinder-shape concentrically around the cylinder-like post 702.

Accordingly, in all embodiments, the present invention minimizes unwanted particles from being deposited onto the tip of the TDEAT gas outlet, as well as the front surface of the faceplate of a showerhead, by carrying away any unreacted TDEAT and the TDEAT/NH$_3$ mixture thereby not allowing back diffusion of the TDEAT.

Figure 7:
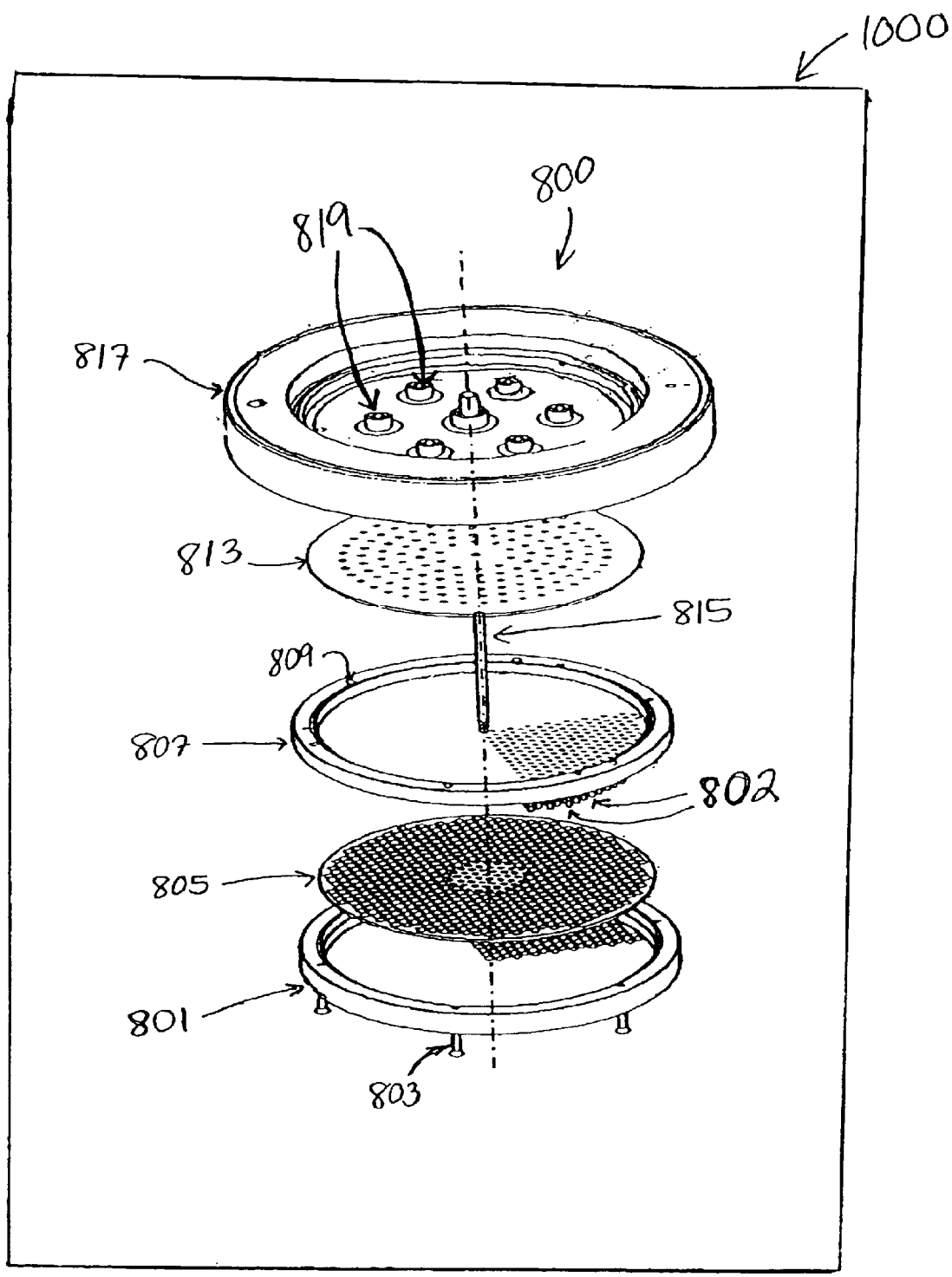
FIG. 7 is an exploded view of a showerhead including the showerhead apparatus of the present invention.

The instant invention may be implemented in a showerhead apparatus 800 as shown in FIG. 7. As will be recognized, FIG. 7 illustrates the showerhead apparatus 800 before assembly. The showerhead apparatus 800 includes a faceplate 801 having a plurality of bolts 803 which are inserted through NH$_3$ baffle 805 for distributing a TDEAT plenum 807, and through a plurality of corresponding holes 809 and into receiving apertures (not shown) in base plate 817 for securing the faceplate, baffle, plenum and base-plate together. It may also be assembled by welding or other known joining techniques. The TDEAT plenum 807 includes a plurality of TDEAT posts 802 extending from a bottom surface thereof whereby once the faceplate, baffle and base-plate are secured together, each of the plurality of TDEAT posts 802 are each directly surrounded by an annular opening as discussed above (the annular openings are visibly undetectable in FIG. 7.) As shown, the plurality of TDEAT posts 802 are only illustrated in a 90° zone for ease of viewing, however, it will be recognized that the plurality of TDEAT posts 802 will encompass the entire 360° zone of the TDEAT plenum, faceplate and the apertures on the faceplate. The number of TDEAT posts on the entire 360° zone of the TDEAT plenum may range from about 100 to about 10,000, with each TDEAT post having directly there-around it an annular opening as described above.

Also as discussed above, the plurality of TDEAT posts 802 may be recessed, flush with front of the faceplate 801 or extend past the faceplate. The showerhead apparatus 800 further includes a TDEAT baffle 813, a tube 815 for distributing the NH$_3$ gas and a housing 817 having a plurality of mountings 819 for a heat exchanger. The apparatus 800 may be provided within a CVD chamber 1000. The CVD chamber also includes a substrate support chuck positioned inside the reactor chamber beneath the faceplate of the showerhead. A wafer is positioned on the support chuck beneath the showerhead for depositing the TDEAT/NH$_3$ mixture to form a film thereon.

FIGS. 8A–8D show the results of a comparative study performed in accordance with the present invention in comparison to a conventional showerhead apparatus emitting only TDEAT. In the study, the flow rate of the emitted gases was scaled by the number of holes or openings in the showerhead (712 holes for the emitted TDEAT and N$_2$ gases, and 2221 holes for the emitted NH$_3$ gas). The process conditions under which the study was performed include a temperature of 120° C., a pressure of 60 Torr, a TDEAT flow of 7.33 sccm (0.0103 sccm per hole), a N$_2$ flow of 1750 sccm (2.46 sccm per hole) and a NH$_3$ flow of 5800 sccm (2.61 sccm per hole). Referring to FIGS. 8A–8D, FIG. 8A shows a conventional TDEAT gas outlet 2 having opening 4 for emitting the TDEAT gas there-through, whereby it is shown that the high TDEAT concentration surrounds the tip of the gas outlet 2 as well as peripheral edges thereof to increase the undesired carbon deposits thereon.

Figure 8B:
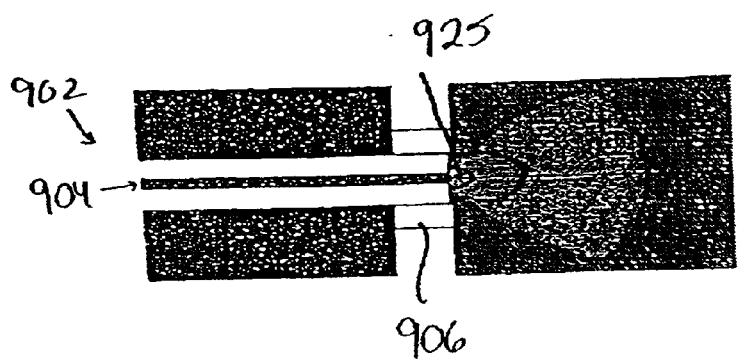
Figure 8C:
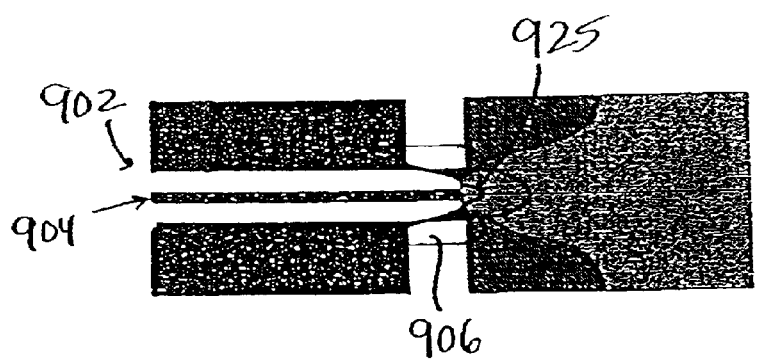
Figure 8D:
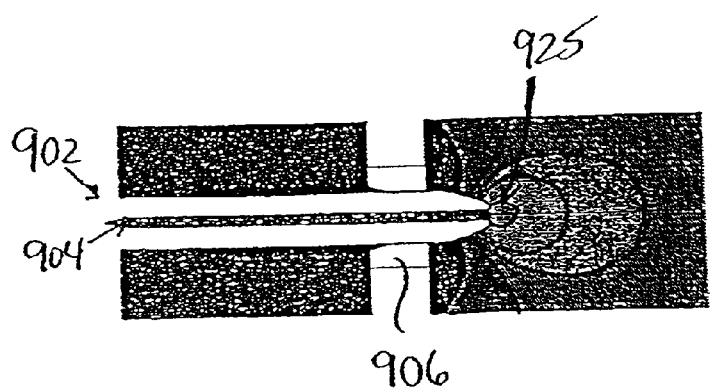

In the present invention, as shown in FIG. 8B, by recessing a cylindrical post 902 by about 0.10 inches from a front surface of the faceplate, the NH$_3$ is brought closer to the TDEAT post 902 thereby reducing the amount of TDEAT 925 deposited along the tip of the TDEAT post and the faceplate. Still further as shown in FIGS. 8C and 8D, the post 902 is tapered at a tip thereof, to a radius of about 0.434 inches. In FIG. 8C, the post 902 is tapered and recessed from the front surface of the faceplate by about 0.10 inches, while post 902 in FIG. 8D is tapered and extends a distance of about 0.19 inches past the front surface of the faceplate. As shown in FIG. 8C, the tip of the recessed post 902 is well bathed in the NH$_3$ gas to provide the most minimization of the high TDEAT concentration surrounding the tip TDEAT outlet.

Figure 9:
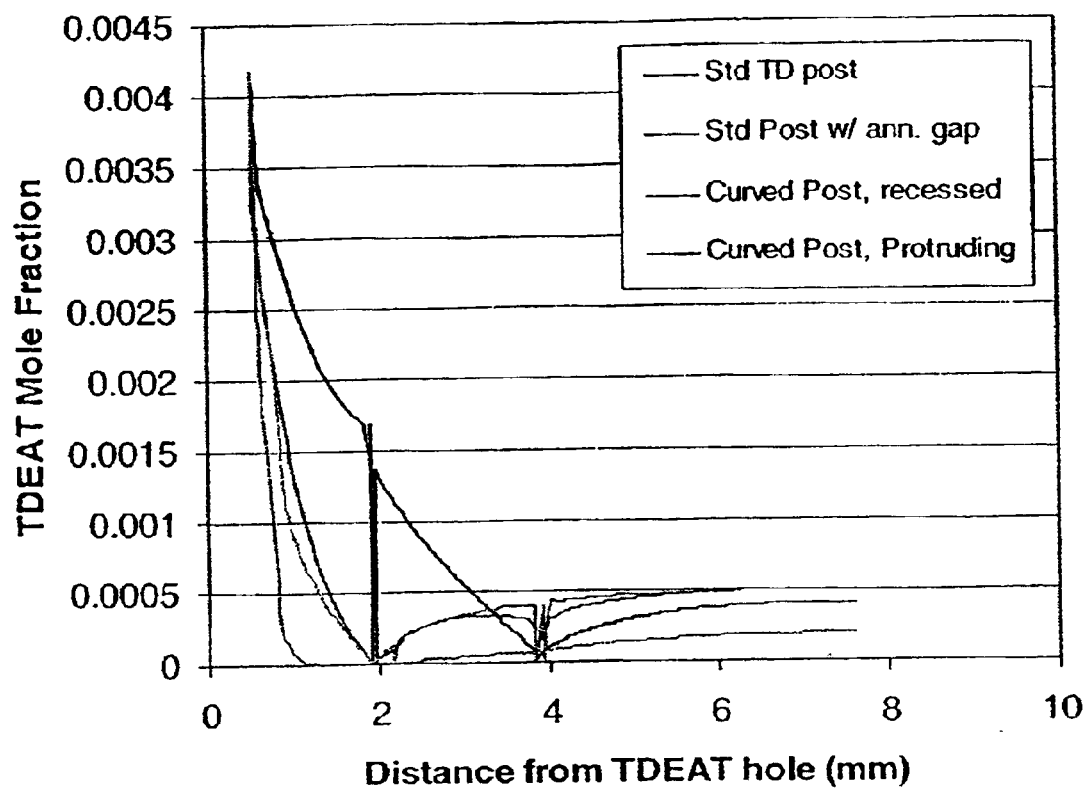
FIG. 9 shows a plot of the TDEAT concentration results of FIGS. 8A–8D on the TDEAT post and faceplate.
Figure 1A:
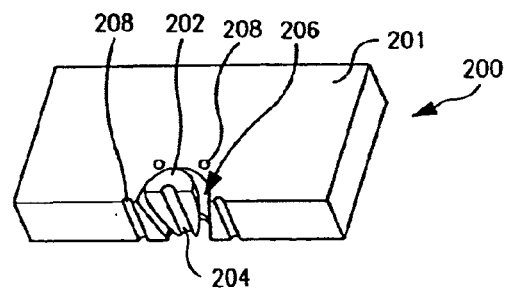
Figure 1B:
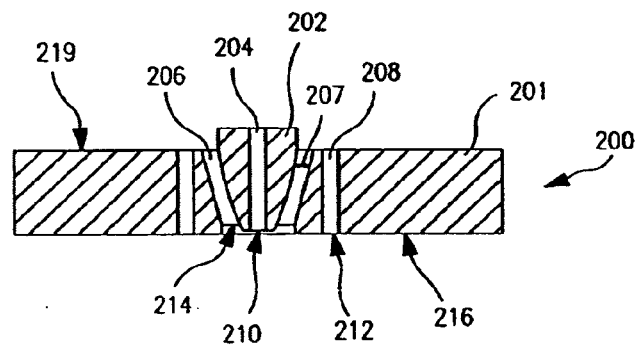
Figure 1C:
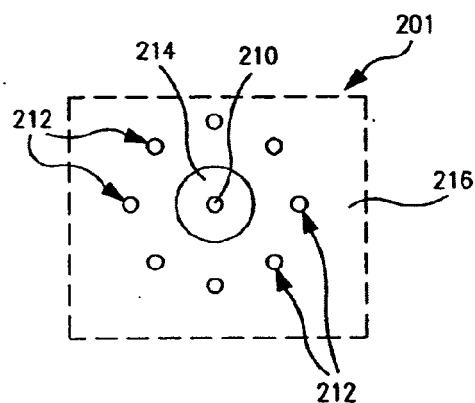
Figure 2A:
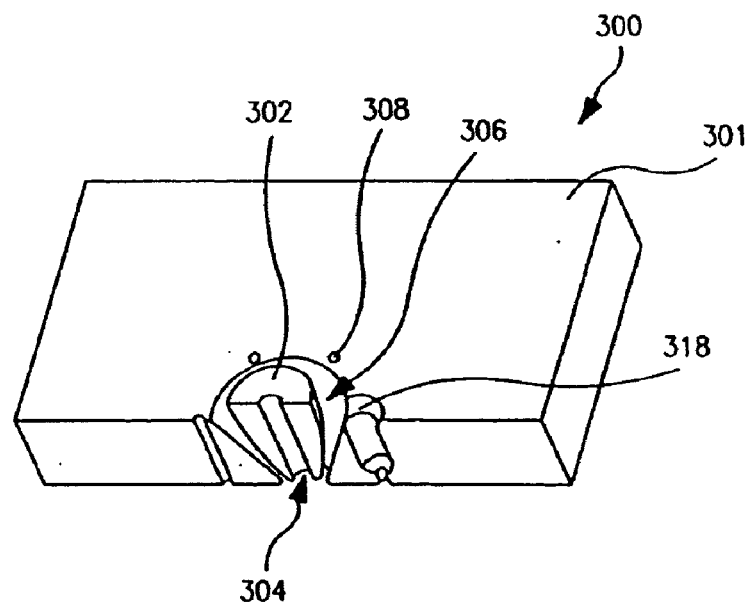
Figure 2B:
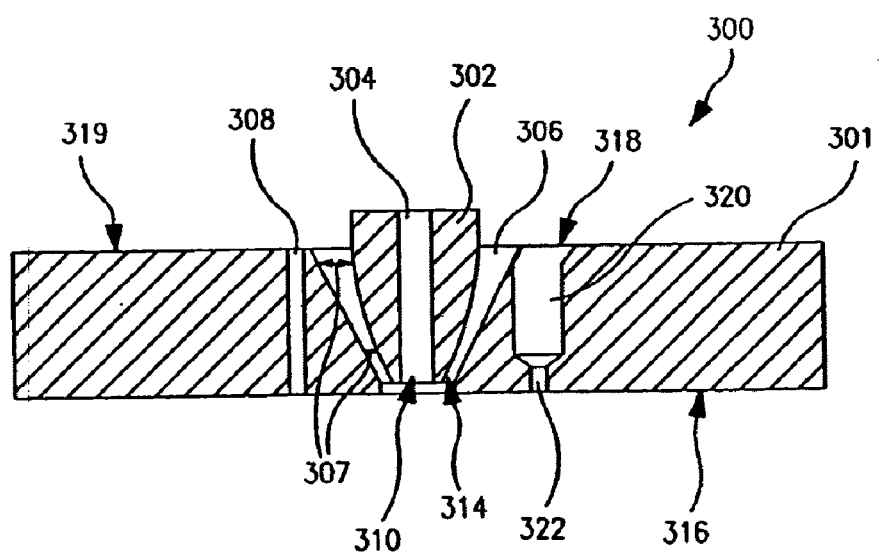
Figure 3A:
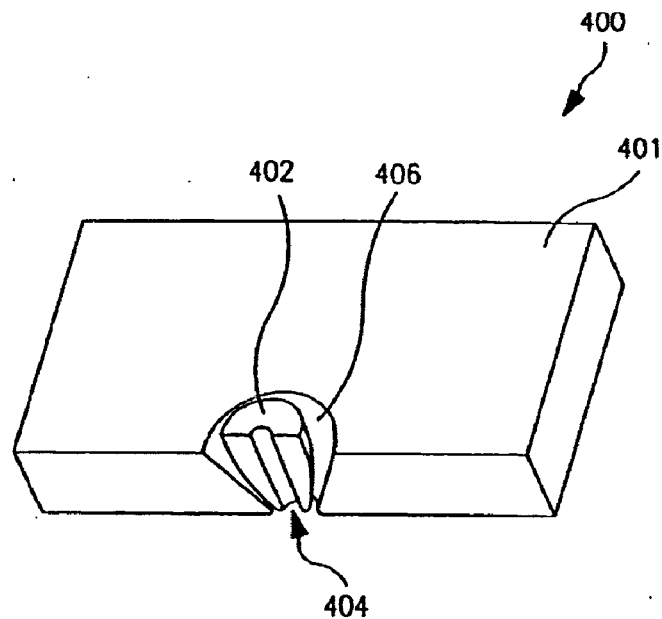
Figure 3B:
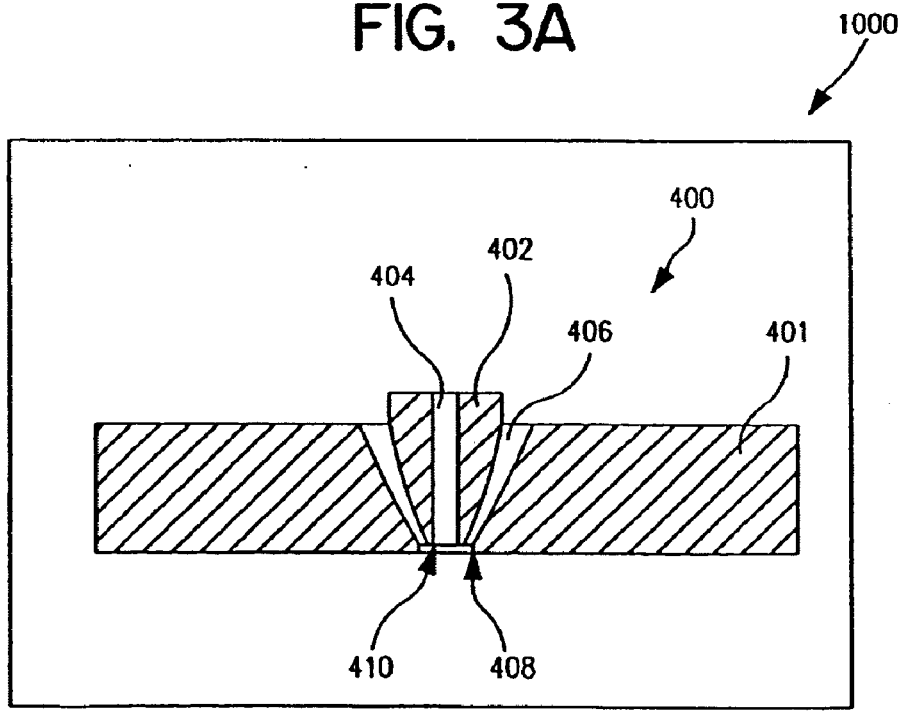
Figure 4:
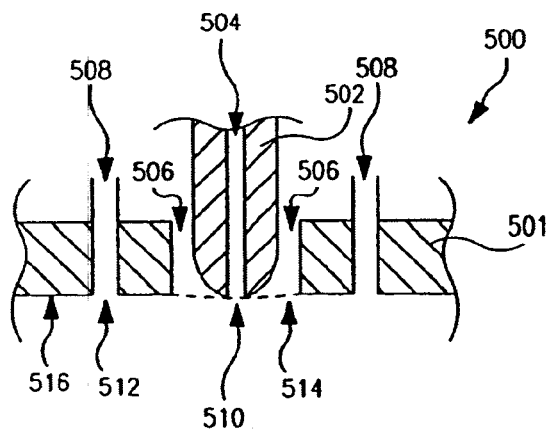
Figure 5:
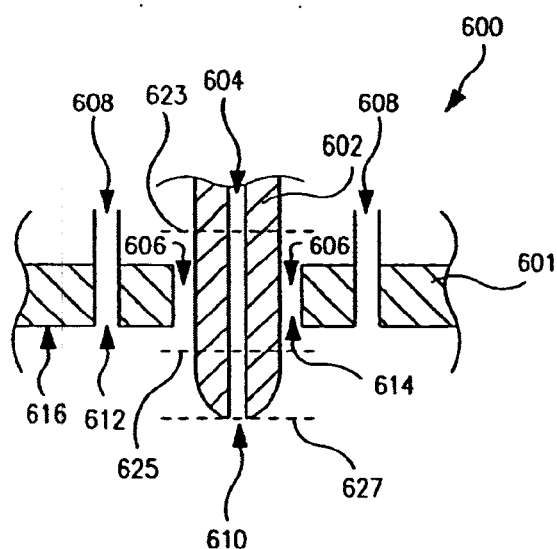
Figure 6:
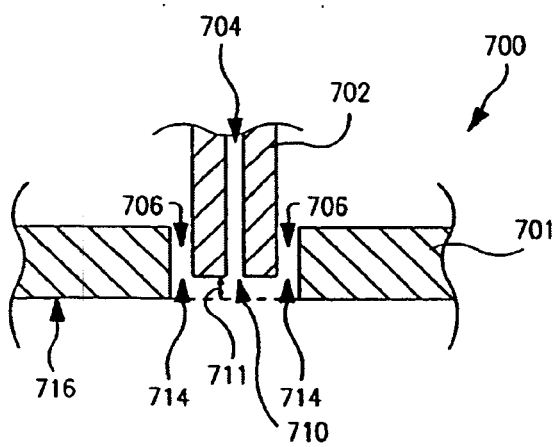
Figure 7:
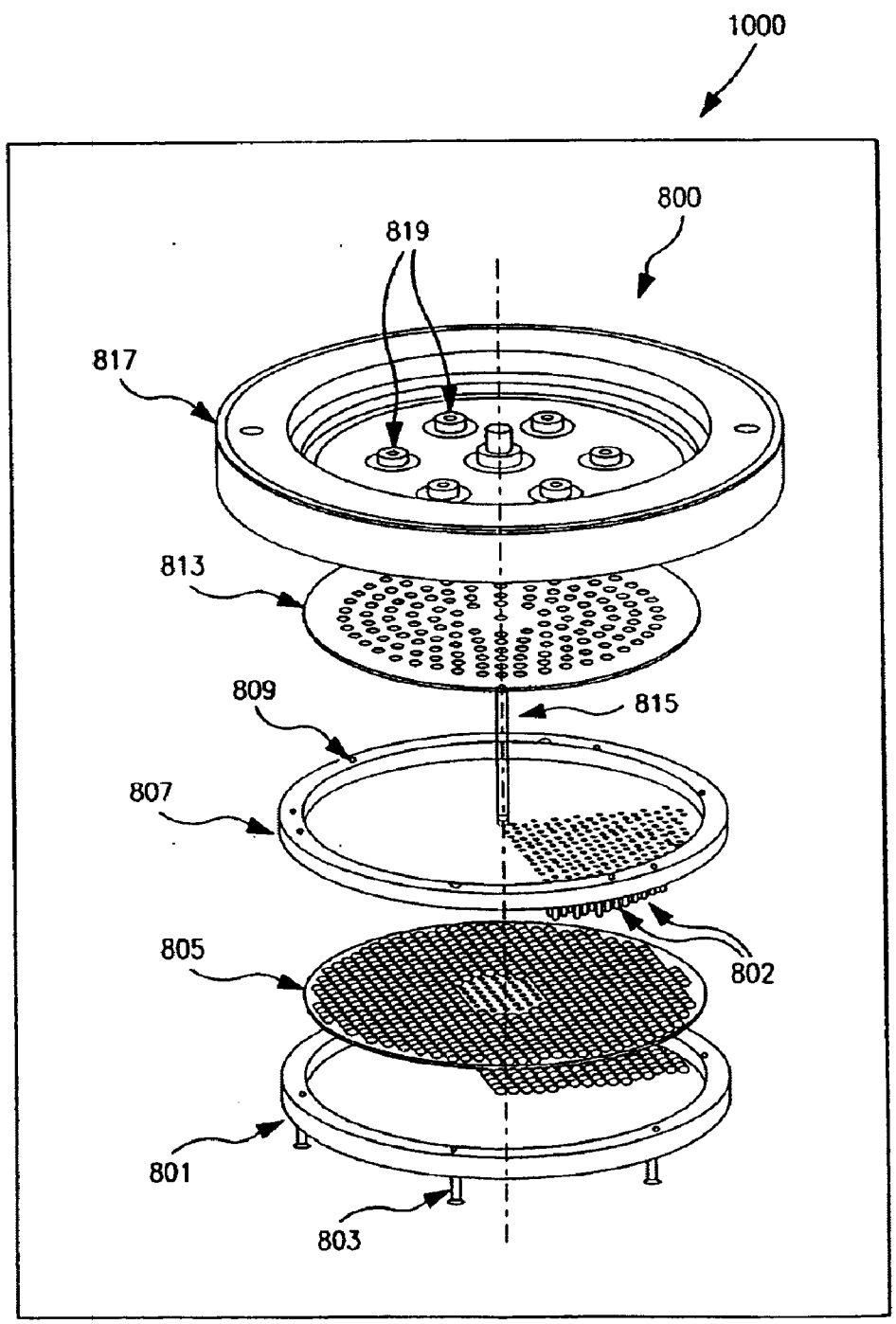
Figure 8A:
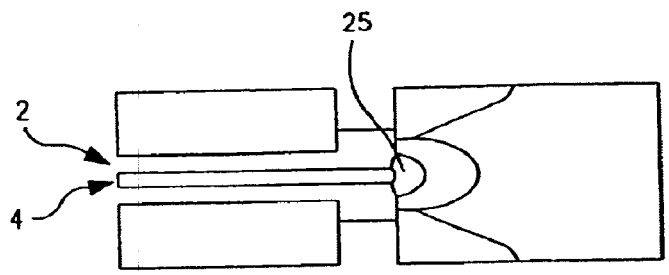
Figure 8B:
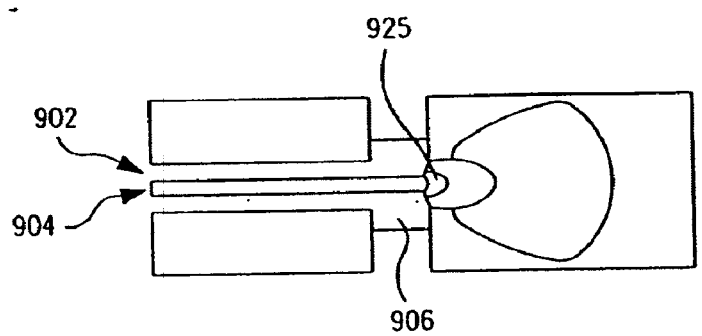
Figure 8C:
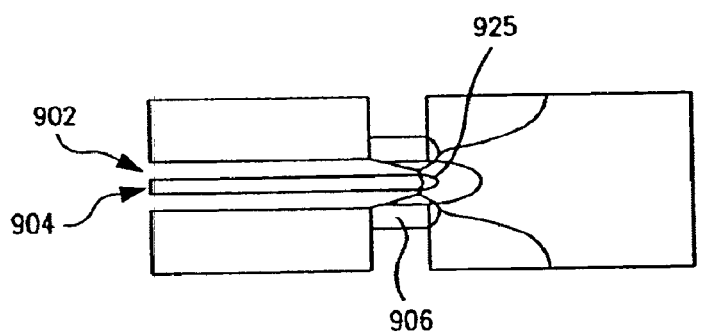
Figure 8D:
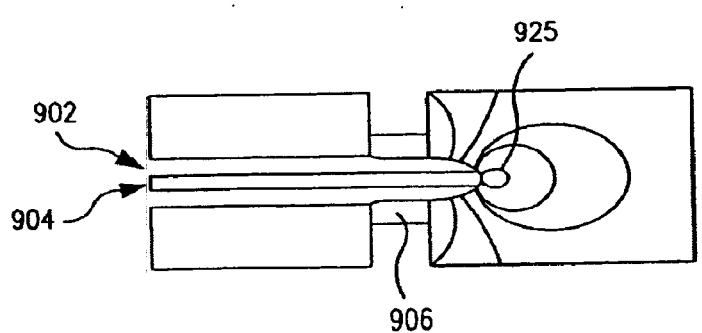
Figure 9:
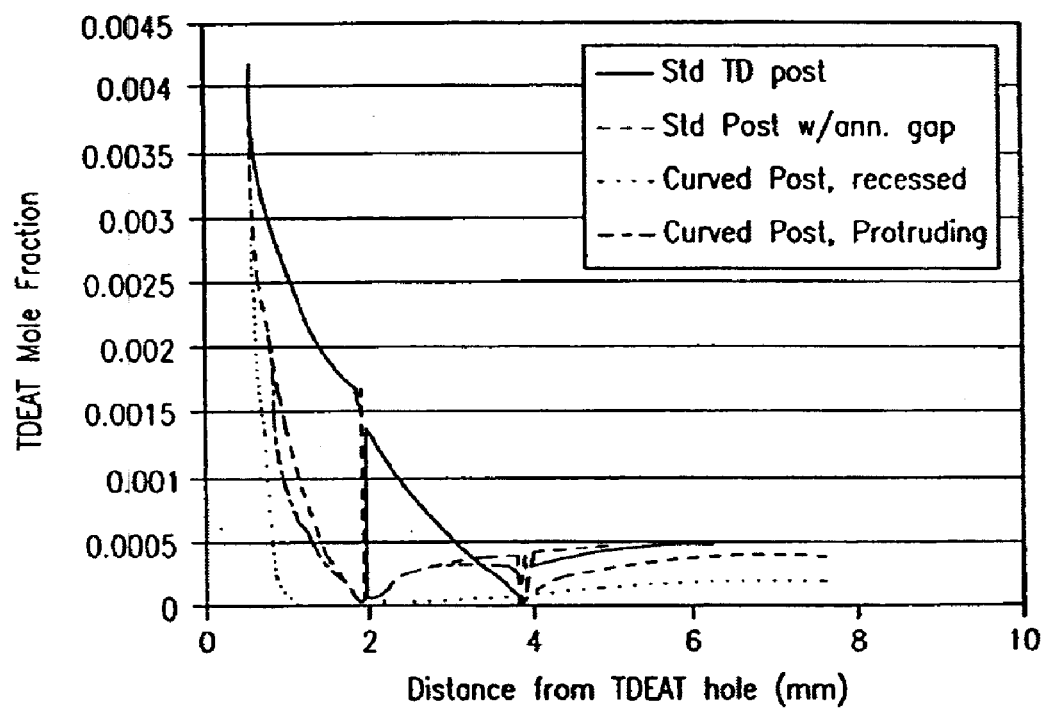

FIG. 9 shows a plot of the TDEAT concentration results of FIGS. 8A–8D on the TDEAT post and faceplate as a function of the distance from opening 904 where the TDEAT gas is released. As shown, the plotted line closest to the left of the graph represents the results of FIG. 8C, followed by the next closest plotted line to the left representing the results of FIG. 8D, followed by the next plotted line to the left representing the results of FIG. 8B, while the plotted line farthest to the right of the graph represents the results of FIG. 8A. Accordingly, it is shown that the baseline configuration of the conventional TDEAT gas outlet of FIG. 8A has the highest high TDEAT concentration levels, while the tapered, recessed post 902 of the invention shown in FIG. 8C, which is well bathed in NH$_3$ gas, has the lowest high TDEAT concentration levels, thereby providing the most minimization of depositing unwanted contaminants on the tip of the post as well as a surface of the faceplate.

Accordingly, the present invention advantageously minimizes the amount of high TDEAT concentration near the tip of the TDEAT gas outlet and faceplate to reduce unwanted deposits of carbon or carbon films. These deposits are particularly difficult to remove, using etching or other means, once deposited on unwanted surfaces of the wafer. Therefore, the reduction of stubborn deposits significantly enhances the cleaning of the showerhead apparatus, as well as, reducing the time needed to remove any remaining unwanted deposits. The reduction of unwanted deposits on the showerhead also maximizes the desirable intermixing of the emitted TDEAT and NH$_3$ gases to enhance the deposition rate onto the wafer thereby positively affecting the efficiency of the deposition process.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A showerhead apparatus for mixing a plurality of gases for deposition of a film using the mixed gases comprising:
   a chemical vapor deposition chamber showerhead emitting and mixing a first gas and a second gas;
   a faceplate of said showerhead;
   a tapered post of said showerhead having a tapered tip that tapers inward as said post extends into said faceplate, said tapered post having a central opening emitting said first gas from said tapered tip of said tapered post; and
   an annular opening of said showerhead positioned in direct contact with and circumferentially about said tapered post emitting said second gas, said annular opening traversing through said faceplate to directly and entirely surround said tapered post,
   wherein said first and second gases are emitted coaxially to each other so that said first and second gases immediately intermix upon release from said tapered tip of said post and said annular opening and simultaneously force away any unreacted first gas and gaseous mixtures from said tapered tip of said post and a surface of said faceplate.

2. The apparatus of claim 1 wherein said annular opening comprises a tapered annular opening said apparatus further including a plurality of apertures traversing through said faceplate, said plurality of apertures being located circumferentially about said tapered annular opening such that said tapering of said annular opening tapers inward toward said post in a direction away from said plurality of apertures.

3. The apparatus of claim 2 wherein said plurality of apertures are adapted to emit said second gas.

4. The apparatus of claim 2 wherein said plurality of apertures further include at least one of said plurality of apertures having an enlarged portion contiguous with a smaller frontal opening of said at least one of said plurality of apertures.

5. The apparatus of claim 1 wherein said first gas is TDEAT or TDMAT.

6. The apparatus of claim 1 wherein said second gas is NH$_3$.

7. The apparatus of claim 1 wherein said annular opening comprises a tapered annular opening said apparatus further including said tapered annular opening tapering inward as it traverses through said faceplate and said tapered post tapering as it extends into said faceplate such that said tapered tip of said tapered post and an end of said annular opening are flush with said surface of said faceplate so that said first and second gases immediately mix at a location in direct contact with said surface of said faceplate.

8. The apparatus of claim 1 wherein said annular opening comprises a tapered annular opening said apparatus further including said tapered annular opening tapering inward as it traverses through said faceplate such that an end of said tapered annular opening is flush with the surface of the faceplate while said tapered tip of said tapered post extending into said faceplate is recessed from said surface of said faceplate so that said first and second gases immediately mix at a location between said tapered tip of said post and said end of the tapered annular opening.

9. The apparatus of claim 8 wherein said tapered post is recessed from said surface of said faceplate to a distance of about 0.12 inches.

10. The apparatus of claim 1 wherein said annular opening comprises a tapered annular opening said apparatus further including said tapered annular opening tapering inward as it traverses through said faceplate such that an end of the tapered annular opening is flush with the surface of the faceplate while said tapered tip of said tapered post extends into said faceplate traversing there-through and extends past said surface of said faceplate so that said first and second gases immediately mix at a location past said end of the tapered annular opening, said surface of said faceplate and said tapered tip of said post.

11. The apparatus of claim 10 wherein said tapered post extends past said surface of said faceplate to a distance of about 0.25 inches.

12. The apparatus of claim 1 wherein said tapered post has a diameter ranging from about 0.06 inches to about 0.05 inches.

13. The apparatus of claim 12 wherein said tapered post includes said inward tapered frontal portion of said post having a tapered diameter ranging from said diameter ranging from about 0.06 inches to about 0.05 inches at a top portion of said inward tapered frontal portion of said post to about 0.02 inches to about 0.25 inches at said tapered tip of said tapered post, said tapered tip of said tapered post being at a bottom portion of said inward tapered frontal portion.

14. The apparatus of claim 1 wherein said annular opening has a width ranging from about 0.21 inches to about 0.005 inches.

15. A showerhead apparatus for mixing a plurality of gases for deposition of a film using said mixed gases comprising:
   a chemical vapor deposition chamber showerhead emitting and mixing a TDEAT gas and a $NH_3$ gas;
   a faceplate of said showerhead;
   a tapered post of said showerhead having a tapered tip that tapers inward as said post extends into said faceplate, said tapered post having a central opening emitting said TDEAT gas from said tapered tip of said post; and
   a tapered annular opening of said showerhead tapering inward toward said tapered post and positioned in direct contact with and circumferentially about said tapered post emitting said NH, gas, said tapered annular opening traversing through said faceplate to directly and entirely surround said tapered post such that said $NH_3$ gas is emitted at a tapered end of said annular opening,
wherein said TDEAT and $NH_3$ gases are emitted coaxially to each other so that said TDEAT and $NH_3$ gases immediately intermix upon release from said tapered post and said tapered annular opening and said $NH_3$ gas simultaneously forces any high TDEAT concentrations and TDEAT/$NH_3$ gaseous mixtures away from said tapered tip of said post and a surface of said faceplate.

16. The apparatus of claim 15 wherein said tapered annular opening tapers inward toward said central opening in said post uniformly or non-uniformly as said tapered annular opening traverses through said faceplate.

17. A showerhead apparatus for mixing a plurality of gases for deposition of a film using said mixed gases comprising:
   a showerhead within a chemical vapor deposition chamber, said showerhead emitting and mixing a first gas and a second gas;
   a faceplate of said showerhead;
   a plurality of tapered posts of said showerhead extending into said faceplate, wherein each of said tapered posts taper inward to a tapered tip of each said posts, each of said tapered posts having a central opening emitting said first gas from said tapered tips of said posts; and
   each of said plurality of tapered posts having a single tapered annular opening of said showerhead tapering inward toward said tapered posts and positioned in direct contact with and circumferentially about each of said tapered posts emitting said second gas, each of said tapered annular opening traversing through said faceplate to directly and entirely surround each of said tapered posts such that said second gas is emitted at a tapered end of each of said tapered annular opening.

18. The apparatus of claim 17 further including a plurality of substantially parallel apertures emitting said second gas traversing through said faceplate located a distance away from and circumferentially about said tapered annular openings such that said tapering of each of said annular opening occurs traversing through said faceplate in a direction away from said substantially parallel plurality of apertures.

19. The apparatus of claim 1 wherein said tapered tip of said tapered post has a shape selected from the group consisting of conical, rounded and spherical.

20. The apparatus of claim 17 wherein said tapered tip of each of said tapered posts has a shape selected from the group consisting of conical, rounded and spherical.

* * * * *

UNITED STATES PATENT AND TRADEMARK OFFICE
CERTIFICATE OF CORRECTION

PATENT NO.    : 6,883,733 B1
DATED         : April 26, 2005
INVENTOR(S)   : Gary Lind It is certified that error appears in the above-identified patent and that said Letters Patent is hereby corrected as shown below:

Replace the drawings as filed with the attached formal drawings.

Column 13,
Line 43, delete "NH," and substitute therefor -- $NH_3$ --.

Signed and Sealed this

Twenty-third Day of August, 2005

JON W. DUDAS
*Director of the United States Patent and Trademark Office*